United States Patent
Sukumaran et al.

(10) Patent No.: US 11,949,763 B2
(45) Date of Patent: Apr. 2, 2024

(54) SYSTEM, DEVICE AND METHOD FOR DATA COMPRESSION IN A RADAR SYSTEM

(71) Applicant: Steradian Semiconductors Private Limited, Bengaluru (IN)

(72) Inventors: Amrith Sukumaran, Bengaluru (IN); G Ranjithkumar, Tiruppur (IN); Gireesh Rajendran, Bengaluru (IN)

(*) Notice: Subject to any disclaimer, the term of this patent is extended or adjusted under 35 U.S.C. 154(b) by 240 days.

(21) Appl. No.: 17/159,275

(22) Filed: Jan. 27, 2021

(65) Prior Publication Data

US 2022/0159097 A1 May 19, 2022

(51) Int. Cl.
| | | |
|---|---|---|
| *H04L 69/04* | (2022.01) | |
| *G01S 13/34* | (2006.01) | |
| *G06F 17/10* | (2006.01) | |
| *G06F 17/40* | (2006.01) | |
| *H03H 17/02* | (2006.01) | |

(52) U.S. Cl.
CPC .............. *H04L 69/04* (2013.01); *G01S 13/34* (2013.01); *G05B 2219/33135* (2013.01); *G05B 2219/45016* (2013.01); *G06F 17/10* (2013.01); *G06F 17/40* (2013.01); *H03H 17/02* (2013.01)

(58) Field of Classification Search
CPC ...................... H04L 69/04; G01S 13/34; G05B 2219/33135; G05B 2219/45016; G06F 17/10; G06F 17/40; H03H 17/02
USPC ........................................................ 342/129
See application file for complete search history.

(56) References Cited

U.S. PATENT DOCUMENTS

| | | | | |
|---|---|---|---|---|
| 4,780,718 A * | 10/1988 | Hudson | ............... | G01S 13/9027 342/25 A |
| 4,837,579 A * | 6/1989 | Pease | ....................... | G01S 7/34 342/197 |
| 5,048,059 A * | 9/1991 | Dent | ..................... | H03G 7/001 375/349 |
| 5,552,788 A * | 9/1996 | Ryan | .................... | G01S 13/762 342/30 |
| 5,933,360 A * | 8/1999 | Larson | ................... | G06F 7/483 708/512 |

(Continued)

FOREIGN PATENT DOCUMENTS

| | | | | |
|---|---|---|---|---|
| DE | 19822848 A1 * | 11/1999 | ............. | G01S 13/90 |
| FR | 2935077 A1 * | 1/2010 | ............. | G01S 7/003 |

(Continued)

OTHER PUBLICATIONS

"Automatic Detection for MTI Processed Radar Signals", Morten Ihlen (Year: 2011).*

(Continued)

*Primary Examiner* — Nuzhat Pervin

(57) ABSTRACT

According to an aspect, a method of data compression in a radar system comprising, converting a plurality of ranges in a first data form into a polar form, determining a plurality of logarithmic values of the plurality of ranges in the polar form, quantising the plurality of logarithmic values of the plurality of ranges with a first bit width that is fewer than a second bit width in the first data form. According to another aspect, the method further comprising quantizing the logarithmic magnitude part with a third bit width and quantising the logarithmic phase part with a fourth bit width.

7 Claims, 6 Drawing Sheets

(56) References Cited

U.S. PATENT DOCUMENTS

| | | | | |
|---|---|---|---|---|
| 6,529,927 | B1* | 3/2003 | Dunham | G06F 17/14 708/400 |
| 8,456,350 | B2* | 6/2013 | Wood | G01S 7/414 342/159 |
| 8,456,352 | B2* | 6/2013 | Wood | G01S 7/34 342/159 |
| 8,797,208 | B2* | 8/2014 | Stirling-Gallacher | G01S 13/343 342/179 |
| 9,176,927 | B2* | 11/2015 | Gross | H03M 13/13 |
| 9,541,637 | B2* | 1/2017 | Searcy | H03M 7/30 |
| 10,056,917 | B2* | 8/2018 | Hong | G06F 7/556 |
| 10,386,462 | B1* | 8/2019 | Hong | G01S 13/46 |
| 10,958,287 | B1* | 3/2021 | Sanderovich | G06F 9/3885 |
| 11,243,304 | B2* | 2/2022 | Hong | G01S 13/723 |
| 11,360,205 | B2* | 6/2022 | Meissner | G01S 13/931 |
| 11,782,148 | B2* | 10/2023 | Subburaj | G01S 13/584 342/109 |
| 2007/0211804 | A1* | 9/2007 | Haupt | H03M 7/3082 375/242 |
| 2008/0191929 | A1* | 8/2008 | Wood | G01S 13/937 342/73 |
| 2009/0128546 | A1* | 5/2009 | Masuda | G06V 10/431 345/419 |
| 2011/0099295 | A1* | 4/2011 | Wegener | H03M 7/46 711/170 |
| 2011/0102244 | A1* | 5/2011 | Jales | G01S 7/5273 342/134 |
| 2011/0291877 | A1* | 12/2011 | Habboosh | G01S 13/10 342/159 |
| 2012/0154204 | A1* | 6/2012 | Wood | G01S 7/414 342/159 |
| 2015/0117470 | A1* | 4/2015 | Ryan | H04L 69/04 370/477 |
| 2015/0346321 | A1 | 12/2015 | Jansen et al. | |
| 2016/0061947 | A1* | 3/2016 | Patole | G01S 13/343 342/195 |
| 2016/0212245 | A1* | 7/2016 | Shoaib | H04L 69/04 |
| 2016/0282450 | A1* | 9/2016 | Kishigami | G01S 13/426 |
| 2017/0054449 | A1* | 2/2017 | Mani | G01S 7/295 |
| 2019/0041494 | A1* | 2/2019 | Roger | G01S 7/352 |
| 2019/0101617 | A1* | 4/2019 | Kishigami | G01S 7/0233 |
| 2019/0187277 | A1* | 6/2019 | Ling | G01S 7/412 |
| 2019/0212428 | A1* | 7/2019 | Santra | H03L 7/06 |
| 2019/0317205 | A1* | 10/2019 | Meissner | H03M 7/3059 |
| 2019/0361105 | A1* | 11/2019 | Kim | G01S 13/343 |
| 2020/0081110 | A1* | 3/2020 | Nam | G01S 13/343 |
| 2020/0150260 | A1* | 5/2020 | Lang | G01S 7/415 |
| 2020/0217945 | A1* | 7/2020 | Long | G01S 13/26 |
| 2020/0284874 | A1* | 9/2020 | Narayana Moorthy | G01S 13/343 |
| 2021/0190941 | A1* | 6/2021 | Natroshvili | G01S 13/91 |
| 2021/0333385 | A1* | 10/2021 | Rohani | G01S 13/87 |
| 2021/0389452 | A1* | 12/2021 | Lau | G01S 13/867 |
| 2021/0396840 | A1* | 12/2021 | Bekooij | G01S 13/723 |
| 2022/0159097 | A1* | 5/2022 | Sukumaran | G01S 13/34 |

FOREIGN PATENT DOCUMENTS

| | | | | |
|---|---|---|---|---|
| FR | | 2935077 A1 * | 2/2010 | G01S 7/003 |
| WO | WO-2022183335 A1 * | | 9/2022 | H04N 19/124 |

OTHER PUBLICATIONS

"An Investigation of the Generalised Range-Based-Detector in Pareto Distributed Clutter", Graham V. Weinberg and Charlie Tran. (Year: 2018).*

"Automatic Detection for MTI Processed Radar Signals", Morten Ihlen (Year: 2011).*

"Distribution of X-Band High Resolution and High Grazing Angle Sea Clutter", Yunhan Dong (Year: 2006).*

"Performance of Non-Parametric CFAR Detectors in Log-Normal and K Radar clutter", A. Bentoumi et al. (Year: 2018).*

"Simulation of W-band Frequency-Modulated Continuous-Wave (FMCW) Radar Signal Processing", Jose Avila (Year: 2019).*

"The Study of CFAR (Constant False Alarm Rate) process for a helicopter mounted millimeter wave radar system", Kim et al. (Year: 2006).*

* cited by examiner

SYSTEM, DEVICE AND METHOD FOR DATA COMPRESSION IN A RADAR SYSTEM

CROSS REFERENCES TO RELATED APPLICATIONS

This application claims priority from Indian patent application No.: 202041050302 filed on Nov. 19, 2020 which is incorporated herein in its entirety by reference.

BACKGROUND

Technical Field

Embodiments of the present disclosure relate generally to Radar system and more specifically to a system, device and method for data compression in a radar system.

Related Art

Radar systems are generally employed for object detection, tracking and terrain mapping etc. Radar systems are increasingly used in various automotive applications such as driver assistance, obstacle detection, avoidance, and navigation of drones/UAVs for example. As is well known, Radars can detect surrounding obstacles or objects and send the relevant information like distance, relative position, direction and velocity of the object(s) that are in motion or still to a controller/central processor (software or hardware) or to a decision making unit in the automotive device like UAV, drone, driver assistance.

As is well known, in the radar system, a radar signal is transmitted and a reflection of the transmitted signal is received for processing and determining parameters and characteristics of one or more objects. Several type of radar signals are employed for transmission and reception of the reflection. For example, in pulsed radar, a sequence of pulses is transmitted and the reflection of the pulses is then processed to determine the objects and its characteristics.

Similarly, in a frequency modulated continuous wave (FMCW) radar system, the radar signal transmitted through antennas is in the form of a varying frequency signal of a fixed duration referred to as chirp that is often generated by a local oscillator, as is well known in the art. In that, received signal (the signal reflected from the object(s)) is mixed with the local oscillator chirp signal to generate a frequency tone(s) representing the range and/or the velocity of the object(s). Plurality of chirps is transmitted over a time frame for determining the velocity or Doppler as is well known in the art.

In some radar systems multiple input multiple output (MIMO) antenna arrays are employed to transmit and receive radar signal. In that, copies of the radar signal are transmitted over the antenna, often to perform beamforming. In that, signals may be transmitted by time division multiplexing, phase shifted, or other known techniques meeting the desired requirement. Generally, the MIMO antennas enable determination of angle of arrival (azimuth and elevation angle) as is well known in the art.

In general, reflected radar signal received over multiple antennas are sampled and digitised for processing. The digital samples accumulated over the time frame and across the array of antennas (referred to as data herein) are processed for determining the range, velocity and angle of arrival. The conventional radar systems and devices employ/ incorporate memory to store the data accumulated over the time frame and across antennas. The memory requirement places several limitations in the radar system based on the applications, number of antennas, number of chirps, radar signal processing resolution, for example.

Conventionally, in some scenarios, the data is compressed to reduce the memory requirement. Some conventional compression techniques are more fully described in the US patent US2017/0054449 and US patent publication US2015/0346321 that are incorporated herein by reference.

SUMMARY

According to an aspect, a method of data compression in a radar system comprising converting a plurality of ranges in a first data form into a polar form, determining a plurality of logarithmic values of the plurality of ranges in the polar form, quantising the plurality of logarithmic values of the plurality of ranges with a first bit width that is fewer than a second bit width in the first data form.

According to another aspect, the method further comprising quantizing the logarithmic magnitude part with a third bit width and quantising the phase part with a fourth bit width.

According to another aspect radar system comprising an analog to digital convertor (ADC) generating a plurality of samples of a radar signal, a range generator generating a plurality of ranges from the plurality of samples, a polar convertor operative to convert the plurality of ranges into corresponding plurality of polar values, a logarithmic (Log) convertor operative to convert the plurality of polar values to plurality of Log values and a memory storing the plurality of Log values;

According to another aspect the radar system further comprising a decompressor operative to convert the plurality of Log values into a plurality of decompressed ranges that corresponds to the plurality of ranges, a doppler generator operative to generate plurality of Doppler from the plurality of decompressed ranges and a angle generator operative to generate plurality of angles from the plurality of dopplers. In that, a first number of bits representing each range in the plurality of ranges is higher than the second number of bits representing the Log values.

Several aspects are described below, with reference to diagrams. It should be understood that numerous specific details, relationships, and methods are set forth to provide a full understanding of the present disclosure. One who skilled in the relevant art, however, will readily recognize that the present disclosure may be practiced without one or more of the specific details, or with other methods, etc. In other instances, well-known structures or operations are not shown in detail to avoid obscuring the features of the present disclosure.

DETAILED DESCRIPTION OF THE PREFERRED EXAMPLES

Figure 1:
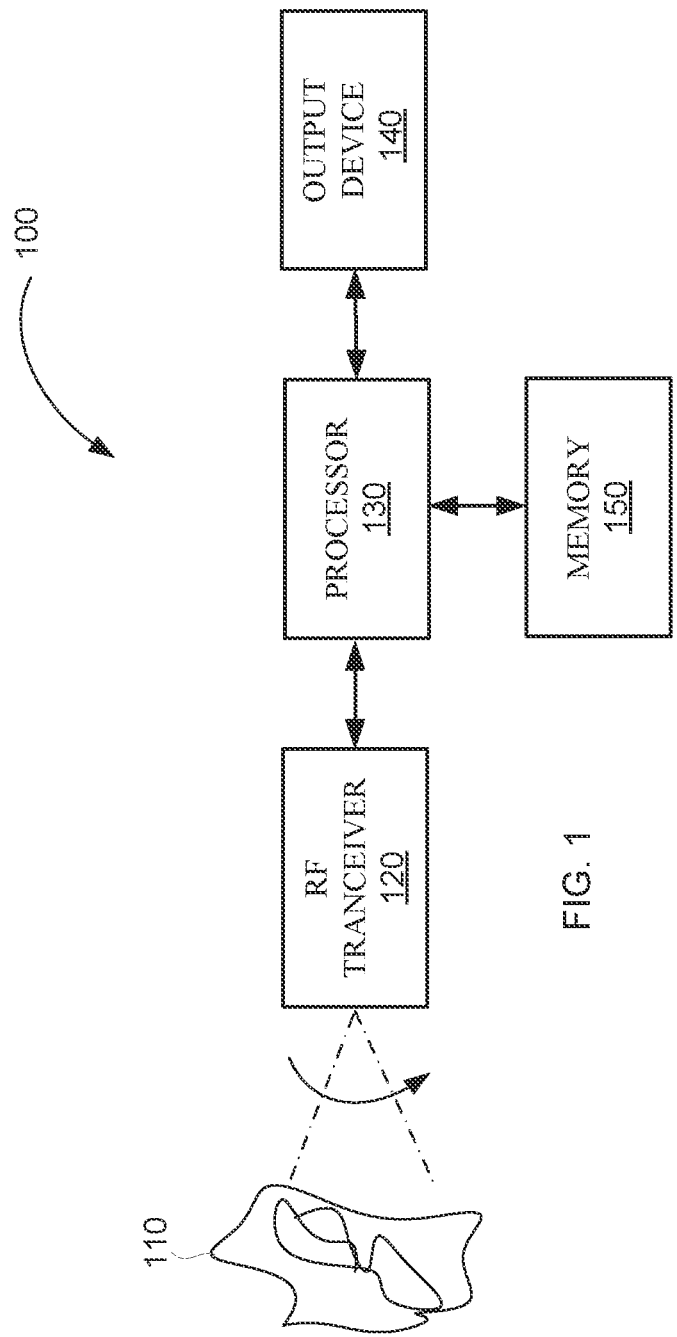
FIG. 1 is a block diagram of an example system 100 (environment) in which various aspects of the present invention may be seen.

FIG. 1 is a block diagram of an example system 100 (environment) in which various aspects of the present invention may be seen. The environment is shown comprising objects 110, Radio Frequency (RF) transceiver 120, processor 130, output device 140 and memory 150. Each element in the system 100 is further described below.

RF transceiver 120 transmits a radar (RF) signal over a desired direction(s) and receives a reflected radar signal that is reflected by the object 110. In one embodiment, the RF transceiver 120 may employ multiple (one or more) receiving antennas to receive the reflected RF signal and multiple (one or more) transmitting antenna for transmitting the radar signal. Accordingly, the transceiver 120 may employ these multiple transmitting/receiving antennas in several of multiple input and multiple output (MIMO) configurations to form desired transmitting and receiving RF signal beam (often referred to as Beam forming) to detect objects from the reflected signal. The objects 110 may comprise a terrain, terrain projections, single object, cluster of objects, multiple disconnected objects, stationary object, moving object, live objects etc.

Processor 130 conditions and processes the received reflected RF signal to detect one or more objects (for example 110) and determines one or more properties of the objects. The properties of the object thus determined (like shape, size, relative distance, relative velocity, location, azimuth and/or elevation angels etc.) are provided to the output device 140. In an embodiment, the processor 130 comprises signal conditioner to perform signal conditioning operations and provides the conditioned RF signal for digital processing. The memory 150 may store RF signal like samples of the reflected RF signal for processing. The processor 130 may temporarily store received data, signal samples, intermediate data, results of mathematical operations, etc., in the memory 150. In an embodiment, processor 130 may comprise group of signal processing blocks each performing the specific operations on the received signal and together operative to detect object and its characteristics/properties.

The output device 140 comprises navigation control electronics, display device, decision making electronic circuitry and other controllers respectively for navigation, display and further processing the received details of the object. Accordingly, the system 100 may be deployed as part of unmanned vehicles, driver assistant systems for example for obstacle detection, navigation and control and for terrain mapping.

In an embodiment, the RF transceiver 120, processor 130, and memory 150 are implemented as part of an integrated circuit (chips) integrated with other functionality and/or as a single chip integrated circuit with interfaces for external connectivity like the output device 140. Accordingly, the processor 130 and the transceiver 120 may be implemented to reduce the overall silicon area in the integrated chip in general and in particular to reduce the requirement of the memory 150. The manner in which the transceiver 120 and the processor 130 (together referred to as Radar transceiver) may be implemented in an embodiment to reduce the requirement of the memory 150 and enhance the processing efficiency is further described below.

Figure 2:
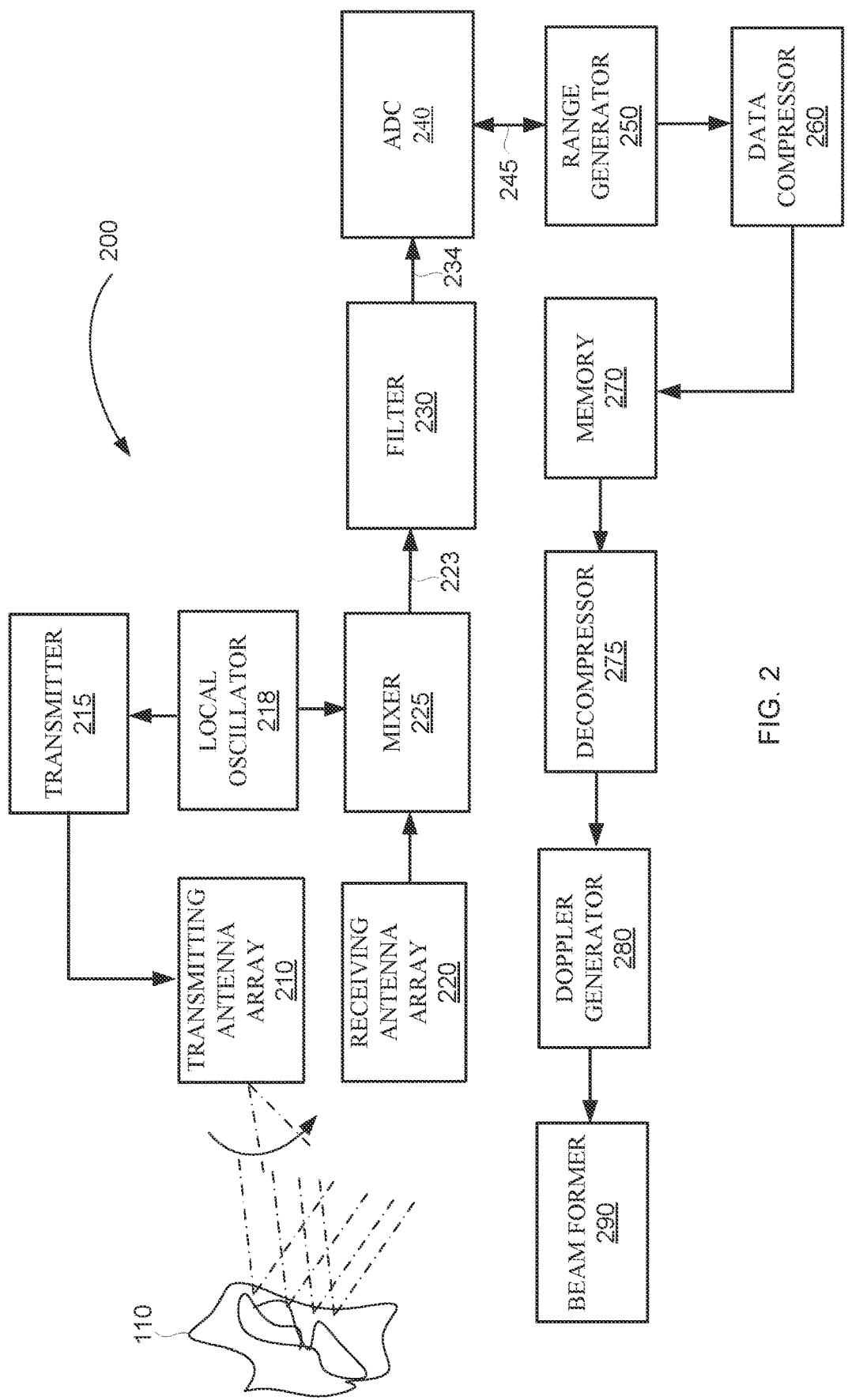
FIG. 2 is an example Radar transceiver in an embodiment.

FIG. 2 is an example Radar transceiver in an embodiment. The Radar transceiver 200 is shown comprising transmitting antenna array 210, transmitter block 215, local oscillator 218, receiving antenna array 220, mixer 225, filter 230, Analog to digital convertor (ADC) 240, Range generator 250, data compressor 260, memory 270, decompressor 275, doppler generator 280 and beamformer 290. Each element is described in further detail below.

The transmitting antenna array 210 and the transmitter 215 operate in conjunction to transmit RF signal. The antenna elements in the transmitting antenna array may be arranged in one dimension or two dimensional arrays. Local oscillator 218 generates modulated signal/radar signal (for example, plurality of chirps) and provides the same to the transmitter 215 and mixer 225. The transmitter 215 arranges/selects the transmitting antennas for transmitting the radar signal and provides the same to the transmitting antenna array for transmission. The transmitting antenna array 210 is employed to form number of transmitting channels. In one embodiment, the transmitting antenna array may also be employed to form a transmit beam with an antenna aperture to illuminate objects at suitable angle.

Figure 3:
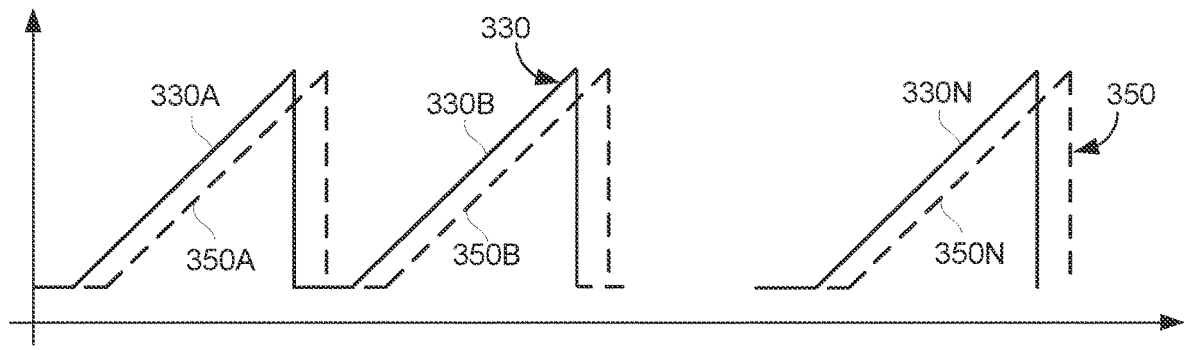
FIG. 3 illustrates the transmitted radar signal and the received radar signal in an embodiment.
Figure 4:
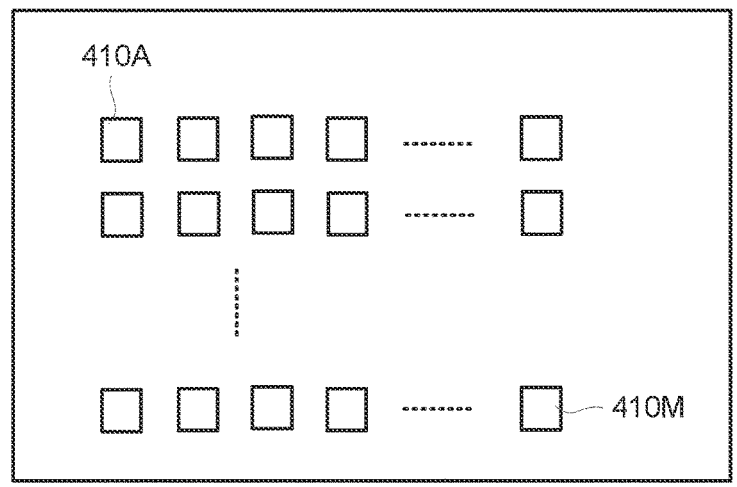
FIG. 4 illustrates an example receiving antenna array.

The receiving antenna array 220 receives reflected RF signal reflected from object 110. The receiving antenna elements may be arranged in one or two dimensional array. FIG. 3 illustrates the transmitted radar signal and the received radar signal in an embodiment. As shown there, the radar signal 330 is transmitted over the transmit antenna array. The radar signal 330 is shown comprising chirps 330A-N. Correspondingly, the reflected signal is shown as 350. The reflected signal is shown comprising chirps 350A-N that is delayed in time due to reflection. The reflected signal 350 (350A-N) are received on the receiving antenna array 220. FIG. 4 illustrates an example receiving antenna array. The receiving antenna array 400 is shown to comprise 410A-410M, forming a two dimensional array of M antennas. The RF signal received on each element is provided to the mixer 225.

The Mixer 225 mixes RF signal received on receiving antenna array 220 with the local oscillator 218 generated radar signal to generate an intermediate frequency signal (IF signal/base band signal). In that the mixer 225 may comprise number of mixers to mix each RF signal received on the corresponding antenna elements. The intermediate frequency signal is provided on path 223 to filter 230. The filter 230 passes the IF signal attenuating the frequency components outside the band of interest (such as various harmonics) received from the mixer. The filter 230 may be implemented as a band pass filter to pass a desired bandwidth (in conjunction with chirp bandwidth BW). The filtered IF signal is provided on path 234 to ADC 240.

The ADC 240 converts IF signal received on path 234 (analog IF signal) to digital IF signals. The ADC 240 may sample the analog IF signal at a sampling frequency $F_s$ and convert each sample value to a bit sequence or binary value. In one embodiment the ADC 240 may generate 256/512/1024/4096 samples per chirp signal. For example, when ADC 240 is operative to produce 4096 samples per chirp, the ADC 240 may generate 4096×M×N number of sample over one frame spanning N chirps. The samples are provided to range generator 250 on path 245.

Figure 5:
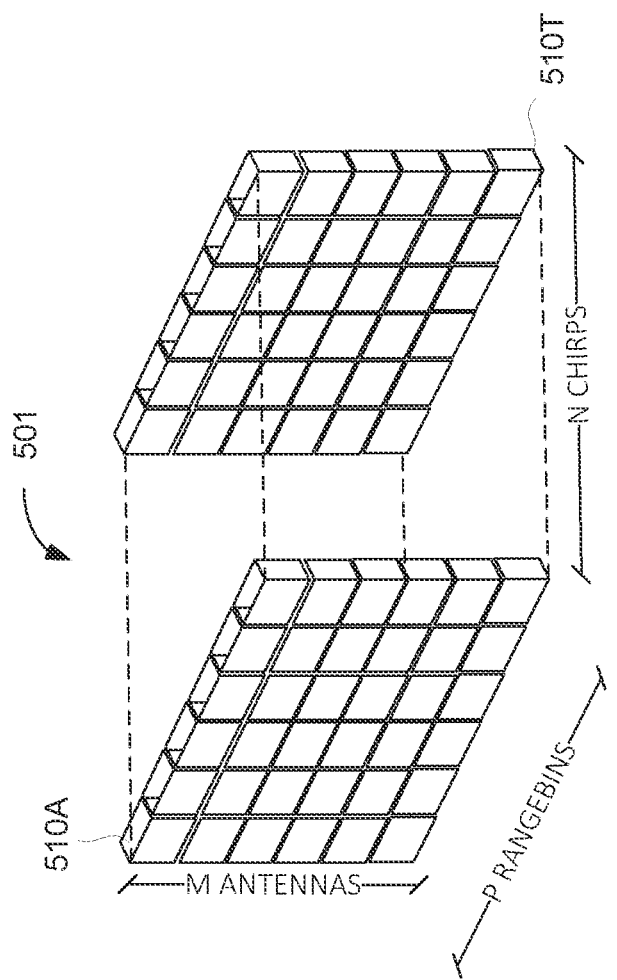
FIG. 5 is an example data generated by the range generator.

The Range generator 250 generates plurality of ranges for every chirp. In one embodiment, the range generator may perform Fast Fourier Transform (FFT) of the samples of each chirp to generate P range bins. For example, range generator 250 may be implemented to process the output of the ADC 240 by a 64-bit complex FFT (32-bits I+32-bits Q), in that I and Q representing in-phase and Quadrature components. Thus, range generator 250 may generate P number of range bins over N chirps and across M antenna elements. An example data generated by the range generator 250 is depicted in the FIG. 5. As shown there, the 510A through 510T represents the total range bins generated in order of P range bins per chirp across N chirps across M antennas. The data 501 represents an example quantum of data produced per frame. It may be appreciated that, as the number of antennas increase in an effort to obtain better angular resolution, the size of the data 501 increases multiple folds. Similarly, as the number of chirps increases in an effort to enhance resolution of the velocity, the data 501 increases by multiple folds. Further, the data 501 is also increased with increase in sampling rate and resolution of ADC 240. Each range 510A-T may be of 64 bits, when 64-bit complex FFT is employed.

The data compressor 260 compresses the data 501 and provides the compressed data to memory 270 for storing and further processing. Due to compression of the data 501, the memory 270 (thus, the memory 150) may be implemented with lesser size. Thus, when the radar system 100 and/or transceiver 200 is implemented on an integrated chip, the space constraints may be adequately overcome. Further, compression of the data 501 enables deployment of more number of antenna elements for better angular resolution and more number of chirps per frame for better velocity resolution without placing constraints on the memory, otherwise a constraint when not compressed. Decompressor 275, fetches the compressed data stored in the memory 275, and decompresses the data in conjunction with the compression operation performed by the data compressor 260. The decompressed data is provided to the doppler 280.

The doppler (unit) 280 operate on the decompressed data received from the decompressor 275 to determine the Doppler (velocities). In one embodiment, the Doppler 280 may fetch decompressed data corresponding ranges 510A-T across N chirps to determine the Doppler. The Doppler 280 may perform FFT across the chirps for corresponding range values to determine the velocities. Similarly, the beamformer 290 determines the angle of arrival of the reflected RF signal to determine the elevation and Azimuth angle of object 110. The beamformer 290 may fetch the output of doppler processed data corresponding to the ranges 510A-T across M antenna and may perform FFT to determine the angle of arrival.

The conventional compression techniques exhibit disadvantages as they work on the assumption that the signal across range can be expressed as a combination of few polynomials or curve and the error with respect to this curve/model can be made low. Other disadvantage being the variable compressed data size—the compressed data size varies with the radar operating terrain. For example, a field with high variation in objects reflected signal strength or dynamic range across range can make the compression inefficient. Still in some other conventional systems employing block floating point, adds a restriction when the transpose of the compressed data needs to be taken due to the common exponent. The Exponential-Golomb when adopted exhibit variable size based on the data.

The data compressor 260 overcomes at least some of the disadvantages of the conventional compression techniques. In one embodiment, the data compressor 260 may provide a relatively higher compression ratio/factor without loss of vital information may provide a fixed and deterministic compression ratio, may be efficient to synthesize in hardware in terms of power and area and enable simple and efficient de-compression for implementation in hardware. The manner in which the data compressor 260 may be implemented in an embodiment is further described below.

Figure 6A:
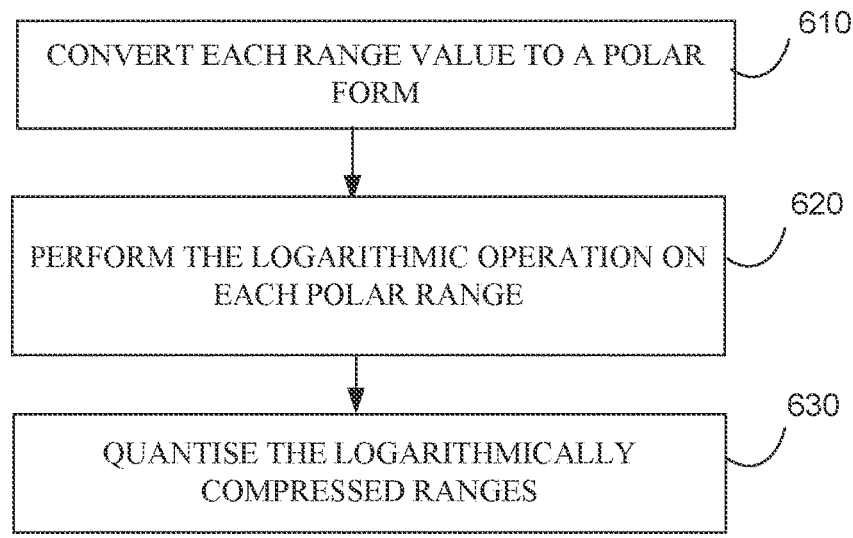
FIG. 6A is a bock diagram illustrating an example data compression in an embodiment.

FIG. 6A is a bock diagram illustrating an example data compression in an embodiment. In block 610, the data compressor 260 converts each range value to a polar form. For example, the range values 510A-T are converted to polar form comprising amplitude and phase values. In one embodiment, when the data units 510A-T are complex numbers represented by in-phase and quadrature component, the block 610 converts the complex number to amplitude and phase values. For example, when the range in-phase component is represented as $R_i$ and the range quadrature phase component is represented by $R_q$, the complex number (referred to as complex range) representing each range 510A-510T may be represented as $R_i+jR_q$. The resulting polar ranges ($P_r$) in polar form may be represented as $A_r e^{j\Phi r}$. In that, $A_r$ representing the magnitude (amplitude) of the polar range ($P_r$) derived from complex number and $\Phi r$ representing the phase of the polar range ($P_r$) derived from the complex number.

In block 620, the data compressor 260 performs the logarithmic operation on each polar range. In one embodiment, the logarithmic operation may provide first level of compression due to incorporation of logarithmic scale on the data. For example the data compressor may perform $\log_2(P_r)$ operation resulting in a logarithmically compressed ranges $(lC_r)=\log_2(A_r e^{j\Phi r})=\log_2(A_r)+j\Phi r$. In that, $\log_2(A_r)$ representing the logarithmic magnitude part of the $lC_r$ and $j\Phi r$ representing the logarithmic phase part of the $lC_r$. Since the Log on exponential operation ($\log_2(_r e^{h\Phi r})$) is phase $j\Phi r$, the logarithmic phase part is referred to as phase part.

In block 630, the data compressor 260 quantises the logarithmically compressed ranges ($lC_r$). In one embodiment, the quantisation is performed independently on magnitude $\log_2(A_r)$ and phase $j\Phi r$ components. The quantisation level may be selected to obtain suitable compression ratio while maintaining the desired signal to noise ratio (SNR) requirement of the system. Accordingly, the quantisation of magnitude $\log_2(A_r)$ and phase $j\Phi r$ places the values at corresponding lower precession level that maybe represented with fewer number bits. The data compressor 260 provides the quantised range values to the memory 270 for storing. The quantised ranges may be represented as $Q_r = [\log_2(Aq_r)+A_N]+j[(\Phi r+\Phi_N)]$. In that, $A_N$ and $\Phi_N$ representing the quantisation noise. The bit width of the quantised log magnitude and phase may be set to different number of bits or may be set to be unequal.

Figure 6B:
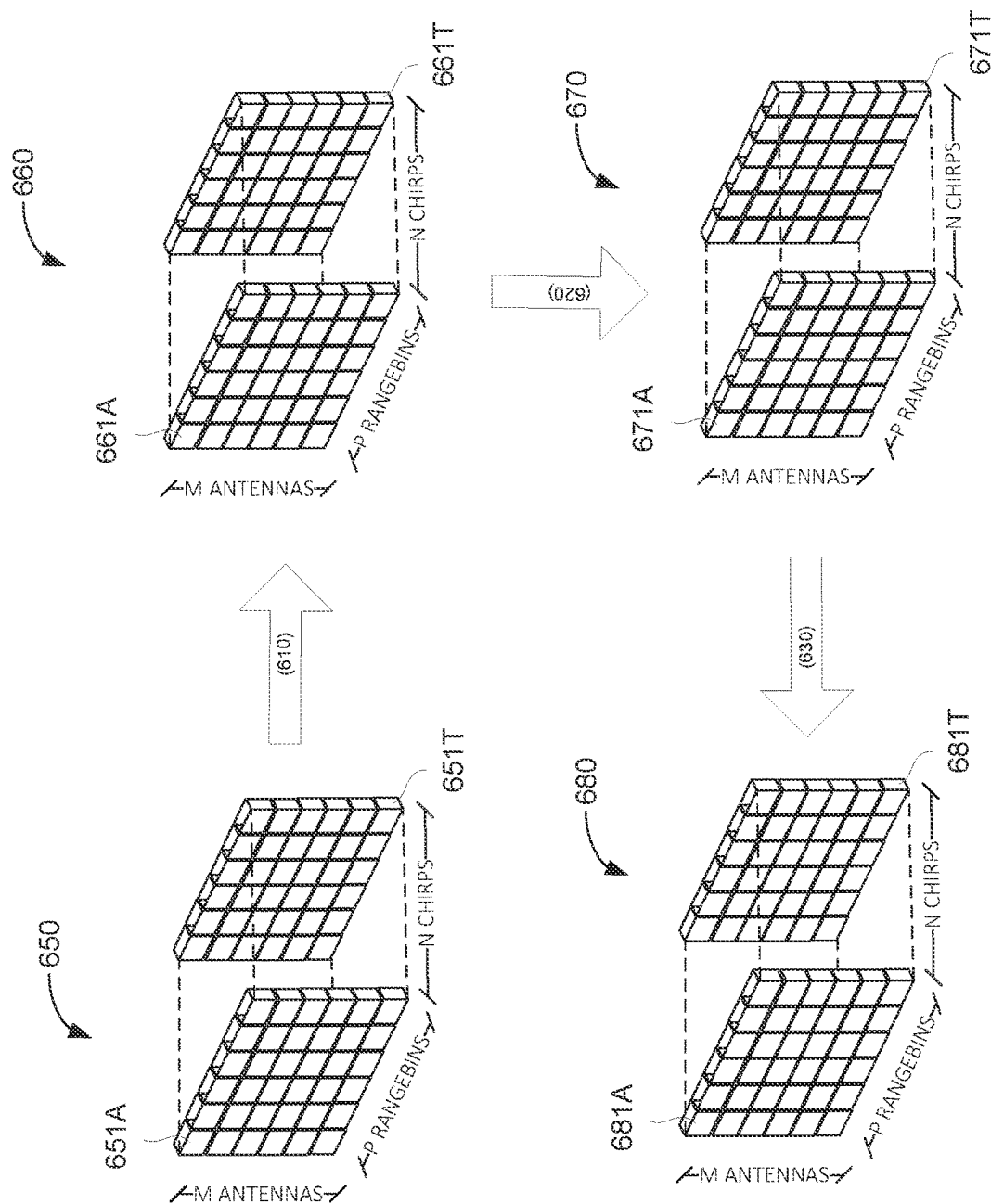
FIG. 6B illustrates an example data block at each level of compression.

FIG. 6B illustrates an example data block at each level of compression. As shown there, the data block 650 represents the complex values corresponding to data block 501. In that, the complex ranges 651A-651T corresponds to respective ranges 510A-T. The data block 660 represents the polar ranges ($P_r$), in that, polar ranges 661A-661T corresponds to respective ranges 510A-T in polar form. The data block 670 represents the logarithmically compressed ranges ($lC_r$), in that, logarithmically compressed ranges 671A-671T correspond to respective ranges 510A-T in logarithmic form. The data block 680 represents the Quantised compressed ranges ($Q_r$), in that, Quantised compressed ranges 681A-681T correspond to respective ranges 510A-T in final compressed form. The memory 270/150 stores Quantised compressed ranges 681A-681T for further processing. As may be seen, the quantised compressed ranges 681A-681T maintain one to one correspondence with ranges 510A-510T. Due to the one to one correspondence, the system operative/configured process the uncompressed data 510 may be readily adapted to operate on the compressed data 681A-T. In one embodiment, when each range 510A-T is repented with 64 bits (32 bit in-phase and 32 bit quadrature phase component) the compressed 681A-681T may be represented with 16 bits. Thus, providing a compression ratio of 4×. Thus substantially reducing the memory requirement.

Figure 7:
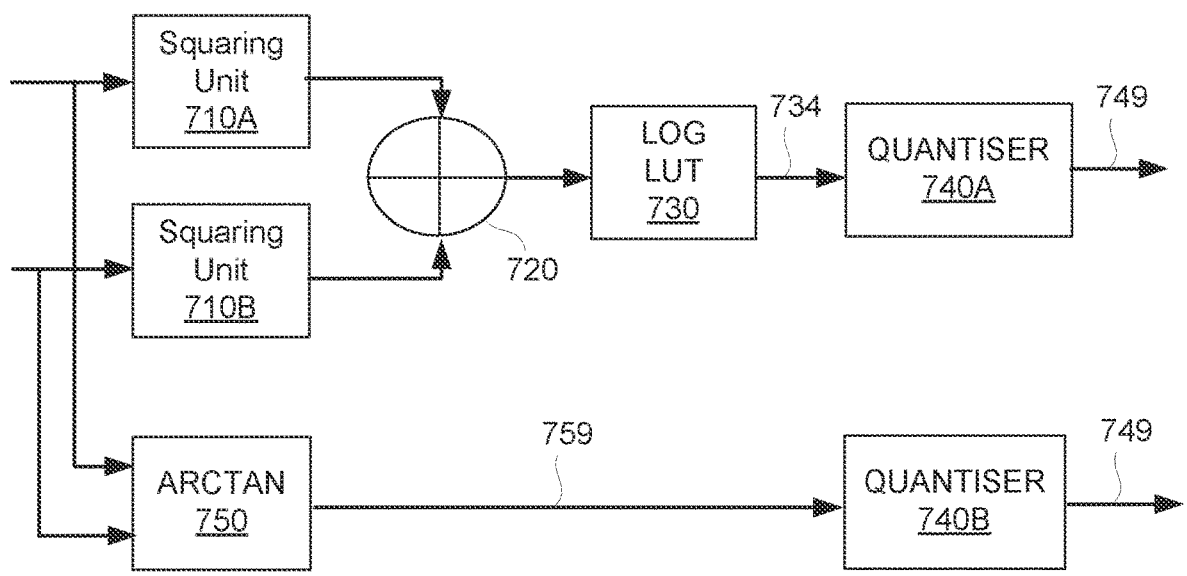
FIG. 7 is a block diagram illustrating the manner in which the data compressor may be implemented on in one embodiment.

FIG. 7 is a block diagram illustrating the manner in which the data compressor 260 may be implemented on in one embodiment. The block diagram is shown comprising squaring units 710A and B, adder 720, square root unit 730, Log LUT 740, quantisers 740A and B, and arctan computation unit 750. Each element is further described below.

The squaring units 710A receive the in-phase component of the range 510A-T. The in-phase component $R_i$ may be of x bits wide, (for example 32 Bits). The squaring units 710A perform the squaring operations on the received in-phase component. The resulting squared in-phase value is provided to the adder 720. Similarly, the squaring units 710B receive the quadrature component of the range 510A-T. The quadrature component $R_q$ may be of x bits wide, (for example 32 Bits). The squaring units 710B perform the squaring operations on the received quadrature component. The resulting squared quadrature value is provided to the adder 720. The adder 720 performs the addition of value received from the squaring units 710A and B to generate magnitude ($A_r$) of the polar range ($P_r$).

The arctan computation unit 750 receives the in-phase range value and quadrature phase range value of each range 510A-T and computes the phase angle as arctan of the ratio of the in-phase $R_i$ and quadrature $R_q$ values. The phase value generated is provided on path 759 represents the phase Φr of the polar range ($P_r$). the phase value on 759 may be provided to quantiser 740B for quantization. The squaring units 710A and B, adder 720, square root unit 730, and arctan computation unit 750 together operative as polar convertor providing magnitude and phase of the ranges in polar form.

The Log LUT (log look up table) 730 converts the polar magnitude $A_r$ to the Logarithmic magnitude $\log_2(A_r)$. In one embodiment, a look-up-table may be implemented to translate the polar value to corresponding logarithmic value based on the expected set of values. The Logarithmic magnitude $\log_2(A_r)$ is provided to the quantiser 740A for quantisation. The quantiser 740A and 740B may respectively quantise the magnitude received on path 734 and the phase received on path 759. In one embodiment, the quantiser 740A and B are implemented to quantise the values to 8 bits width. Accordingly, the quantised range magnitude and phase (provided on path 749A and 749B) are 8 bits wide and may be stored in the memory. As an example, when a required SNR to detect objects with RCS of 25 is 23 db, the ranges 510A-T of 64 bits may be compressed to 16 bits by quantising to 8 bits. That is quantiser 740A and B may be implemented with 8 bits wide may detect the objects with RCS (Radar Cross Sectional Area) difference of 25 dB with a signal to noise ratio of 20 dB. Similarly, based on the required RCS, the SNR and known SNR, the bit width of the quantiser 740A and B may be selected.

While various examples of the present disclosure have been described above, it should be understood that they have been presented by way of example, and not limitation. Thus, the breadth and scope of the present disclosure should not be limited by any of the above described examples, but should be defined in accordance with the following claims and their equivalents.

What is claimed is:

1. A method of data compression in a radar system comprising:
   transmitting a radar signal comprising a plurality of chirps over one or more transmitting antennas, wherein the radar signal is a radio frequency (RF) signal;
   receiving a reflected signal on a plurality of receiving antennas, the reflected signal is reflection of the radar signal by one or more objects;
   generating a plurality of intermediate frequency (IF) signals in a corresponding plurality of mixers, each mixer in the plurality of mixers receiving a reference signal and a corresponding one of signal from the plurality of receiving antennas;
   generating a plurality of ranges from the plurality of IF signals, wherein every range in the plurality of ranges is in a first data form with first bit width and number of ranges T in the plurality of ranges being equal to P X N X M, in that, P representing the number ranges for every chirp, N representing number of chirps in the plurality of chirps and M representing number of receiving antennas in the plurality of receiving antennas;
   converting every range in the plurality of ranges from the first data form into polar form to generate a corresponding plurality of polar ranges in polar form;
   converting every polar range in the plurality of polar ranges to logarithmic value to generate a plurality of logarithmic ranges;
   quantizing every logarithmic range in the plurality of logarithmic ranges with a second bit width that is fewer than the first bit width to form a plurality of compressed ranges,
   wherein number of the plurality of polar ranges, number of the plurality of logarithmic ranges and number of plurality of compressed ranges are equal to the number ranges T in the plurality of ranges.

2. The method of data compression as claimed in claim 1, wherein the first data form is a complex number of a form $R_i + jR_q$, in that $R_i$ is an in-phase component and $R_q$ is a quadrature component of the complex number.

3. The method of data compression as claimed in claim 2, wherein the polar form is $A_r e^{j\Phi r}$, in that, $A_r$ representing the magnitude (amplitude) and $\Phi_r$ representing the phase derived from the complex number.

4. The method of data compression as claimed in claim 3, wherein the logarithmic value is of the form $\log_2(A_r) + j\Phi_r$, in that, $\log_2(A_r)$ representing a logarithmic magnitude part and $j\Phi_r$ representing a logarithmic phase part of the plurality of logarithmic values.

5. The method of data compression as claimed in claim 4, further comprising quantizing the logarithmic magnitude part with a third bit width and quantizing the logarithmic phase part with a fourth bit width, the third bit width and the fourth bit width together forming the second bit width.

6. A radar system comprising:
   a transmitting antenna transmitting a radar signal comprising a plurality of chirps, wherein the radar signal is a radio frequency (RF) signal;
   a plurality of receiving antenna receiving a reflected signal, the reflected signal is reflection of the radar signal by one or more objects;
   a plurality of mixers mixing a reference signal and a corresponding one of signal from the plurality of receiving antennas to generating a plurality of intermediate frequency (IF) signals;

a plurality of analog to digital convertor (ADC) sampling the plurality of IF signals to to generate a plurality of digital samples of the plurality of IF signals;

a range generator configured to generate a plurality of ranges from the plurality of samples of a reflected radio frequency (RF) signal wherein number of ranges T in the plurality of ranges being equal to P X N X M, in that, P representing the number ranges for every chirp, N representing number of chirps in the plurality of chirps and M representing number of receiving antennas in the plurality of receiving antennas;

a polar convertor converting every range in the plurality of ranges from the first data form into polar form to generate a corresponding plurality of polar ranges in polar form;

a logarithmic (Log) convertor converting every polar range in the plurality of polar ranges to logarithmic value to generate a plurality of logarithmic ranges; and a quantiser quantizing every logarithmic range in the plurality of logarithmic ranges with a second bit width that is fewer than the first bit width to form a plurality of compressed ranges wherein number of the plurality of polar ranges, number of the plurality of logarithmic ranges and number of plurality of compressed ranges are equal to the number ranges T in the plurality of ranges.

7. The radar system of claim 6, further comprising;

a decompressor configured to convert the plurality of compressed ranges into a plurality of decompressed ranges that corresponds to the plurality of ranges;

a doppler generator configured to generate plurality of Doppler from the plurality of decompressed ranges; and an angle generator configured to generate plurality of angles from the plurality of Dopplers.

* * * * *